US012749804B2

(12) United States Patent
Hollander et al.

(10) Patent No.: US 12,749,804 B2
(45) Date of Patent: Sep. 29, 2026

(54) RADOME AND METHOD OF DESIGN THEREOF

(71) Applicant: Israel Aerospace Industries Ltd., Lod (IL)

(72) Inventors: Yair Hollander, Lod (IL); Yossi Guetta, Lod (IL); Osnat Fried, Lod (IL); Dana Mezan, Lod (IL)

(73) Assignee: Israel Aerospace Industries Ltd., Lod (IL)

( * ) Notice: Subject to any disclaimer, the term of this patent is extended or adjusted under 35 U.S.C. 154(b) by 39 days.

(21) Appl. No.: 18/852,019

(22) PCT Filed: Mar. 23, 2023

(86) PCT No.: PCT/IL2023/050307
§ 371 (c)(1), (2) Date: Sep. 27, 2024

(87) PCT Pub. No.: WO2023/199302
PCT Pub. Date: Oct. 19, 2023

(65) Prior Publication Data

US 2025/0210855 A1 Jun. 26, 2025

(30) Foreign Application Priority Data

Apr. 11, 2022 (IL) ........................................ 292212

(51) Int. Cl.
*H01Q 1/42* (2006.01)
*G06F 30/17* (2020.01)

(52) U.S. Cl.
CPC ............... *H01Q 1/42* (2013.01); *G06F 30/17* (2020.01)

(58) Field of Classification Search
CPC . H01Q 1/38; H01Q 1/42; H01Q 1/422; G06F 30/15; G06F 30/17; G06F 2113/10
See application file for complete search history.

(56) References Cited

U.S. PATENT DOCUMENTS

2009/0179813 A1* 7/2009 Turner .................. H01Q 21/26 343/793
2019/0232555 A1 8/2019 Shaw et al.
(Continued)

FOREIGN PATENT DOCUMENTS

| | | |
|---|---|---|
| WO | 2016092191 A1 | 6/2016 |
| WO | 2020035687 A1 | 2/2020 |
| WO | 2022066083 A1 | 3/2022 |

OTHER PUBLICATIONS

International Search Report and Written Opinion for International Application No. PCT/IL2023/050307 mailed Jun. 4, 2023.
(Continued)

*Primary Examiner* — Thai Pham
(74) *Attorney, Agent, or Firm* — Ballard Spahr LLP

(57) ABSTRACT

A method for use in designing a radome and respective radome structure are presented. The method comprising: providing data on physical shape of the radome, and data on one or more convergence points within said radome; determining general propagation paths mapping propagation of radiation from said one or more convergence points, and one or more selected angular ranges for emission from at least one of said convergence points; determining intersection of said external shape and said mapping of the general propagation paths, within at least said one or more selected angular ranges, and determining one or more tessellated layers for said radome. Wherein cross-section of elements of said one or more tessellated layer with said general propagation path of radiation emitted from the respective convergence location is constant within said one or more selected angular ranges.

18 Claims, 5 Drawing Sheets

(56) References Cited

U.S. PATENT DOCUMENTS

| | | | | |
|---|---|---|---|---|
| 2020/0058991 | A1* | 2/2020 | Adugna | H01Q 1/28 |
| 2020/0393537 | A1* | 12/2020 | Tanaka | G01S 7/354 |
| 2021/0376443 | A1* | 12/2021 | Wu | H05K 9/00 |
| 2023/0275355 | A1* | 8/2023 | Poulsen | H01Q 15/0013<br>343/872 |
| 2024/0072429 | A1* | 2/2024 | Talai | H01Q 1/32 |
| 2024/0201320 | A1* | 6/2024 | Kang | H01Q 1/3233 |

OTHER PUBLICATIONS

Dankov, et al., "Practical Isotropy and Anisotropy of 3-D Printed Artificial Foam-Like Dielectrics with Antenna Applications", 12th International Congress on Artificial Materials for Novel Wave Phenomena-Metamaterials 2018; DOI: 10.1109/MetaMaterials.2018.8534070, Aug. 27-Sep. 1, 2018, 9 pages.

Narayan, et al., "Novel Metamaterial-Element Based FSS for Airborne Radome Applications", IEEE Transactions on Antennas and Propagation; DOI 10.1109/TAP.2018.2851365, 2018, pp. 1-13.

* cited by examiner

RADOME AND METHOD OF DESIGN THEREOF

TECHNOLOGICAL FIELD

The present disclosure is in the field of radome design and construction, and specifically relates to radome design configured to provide isotropic characteristics with respect to electromagnetic (EM) radiation passing therethrough toward or from one or more antennas located inside the radome.

BACKGROUND

A radome is a structural enclosure designed and used for protection of various elements mounted on selected platforms. Radomes are often used in aerial platforms, mobile land platforms and stationary platforms to provide protection of selected elements and allow certain level of communication through the radome. In addition to the above, in the example of aerial or mobile platforms, radomes are also generally designed to follow aerodynamic requirements while providing physical strength and stability that meet necessary environmental conditions.

Typical conventional radome design is formed of one or more structural layers selected to provide strength and stability. The overall radome structure (either single or multi-layered) is generally designed to minimize attenuation of electromagnetic signals passing therethrough. In other words, a typical radome is designed to be generally transparent to electromagnetic radiation in one or more radio frequency (RF) ranges or bandwidths.

Recent developments in material design and additive manufacturing techniques (e.g., three-dimensional printing) enable quick and low-cost manufacturing of radome structures. These techniques provide various advantages such as obviating the need for expensive molds, the need for clean rooms, and manual labor in layering material sheets.

WO 2020/035687 provides a structure at least partially transparent to radio frequency signals, the structure being formed of a tessellated polyhedral material comprising a plurality of polyhedral cells. This technique also provides a method of manufacturing the same.

WO 2016/092191 relates to a method for manufacturing a dielectric part in which a plurality of dielectric materials are interlocked, at least one of which is in solid state, and having at least one relative electromagnetic constant $\varepsilon_r$, $\mu_r$ with various values, by selecting an interlocking structure formed by a three-dimensional solid lattice made up of a repetition in three directions of space of meshes of at least one solid dielectric material. The dielectric part is manufactured by three-dimensional printing of the three-dimensional solid lattice such that the part has at least one predetermined tensor of at least one relative electromagnetic constant $\varepsilon_r$, $\mu_r$.

GENERAL DESCRIPTION

As indicated above, conventional radome construction made of composite materials may often be formed by manual and/or robotic layering of sheets and materials. This construction technique typically requires extensive labor and suitable molds to provide desired radome structures. Advances in additive manufacturing, such as three-dimensional (3D) printing techniques, enable manufacturing of selected radome structures using computer generated models, while greatly reducing labor and manufacturing costs. Typically, such radome structures may be formed of various materials suitable for use in additive manufacturing including for example thermoplastic and thermosetting materials. Generally, the radome may be formed of metallic and/or non-metallic materials suitable for use in additive manufacturing techniques.

Material requirements for additive manufacturing, together with design flexibility of the technique, open new directions in radome design. Conventional layered radomes utilize one or more core layers (e.g., honeycomb) and shell layers covering the core layer. The number of layers and their thickness can be selected to provide a radome structure that allows transmission of electromagnetic radiation at one or more certain selected frequency ranges. The use of additive manufacturing enables selected designs of one or more internal structures of the radome layers, allowing desired transmission and/or reflection properties of the entire structure.

Thus, the present technique provides a radome design having desired effective transmission/reflection properties for radiation transmitted from, or received by, one or more antenna units located therein. The effective transmission and reflection properties are typically averaged over a certain angular region of the radome covering an angular range of the respective antenna units. More specifically, transmission and reflection may be affected by the properties of the material or materials forming the radome. However, alignment of features of the radome, layer thicknesses, sizes of spatial features, and orientation of the features may affect transmission and reflection properties for different radiation propagation directions. Variation in transmission properties may result in effective change in transmission properties for different angular directions. The radome of the present technique is formed to provide isotropic transmission and reflection properties within one or more selected angular ranges, indicating that the effects of the radome on transmitted/received signals are substantially constant (typically with up to 5%-10% variation) for angular ranges determined for use by an antenna system positioned within the radome.

Generally, various composite based radomes are formed of one or more core layers and may include additional layers. Such additional layers may include an internal layer, typically facing elements located within the radome such as antenna systems, and an external layer typically facing environment other than elements protected by the radome. The different layers may be bonded together in various techniques including, e.g., selected adhesives, or formed during additive manufacturing of the one or more core layers. The one or more core layers may include at least one layer formed of a tessellated structure to provide specific strength and/or desired electrical properties to the structure. Further, the external most layer is generally a cover layer providing protection from environmental and other external conditions and may be formed of one or more thin sheets. It should be noted that according to the present technique, the radome may be formed by additive manufacturing as a whole, i.e., including internal and/or external layers. Alternatively, one or more layers of the radome may be formed by additive manufacturing, and one or more additional layers may be added separately from the additive manufacturing process to complete the radome structure.

The present technique provides a radome having at least one tessellated layer configured to provide desired transmission and/or reflection properties to electromagnetic radiation passing through the radome. In some embodiments of the present disclosure, the radome is configured to provide effective transmission properties (associated with general transmission and reflection properties of the radome) that are isotropic with respect to angular variation to radiation paths about one or more selected convergence points. For example, the radome is generally configured to be placed over one or more antenna units, located in the one or more selected convergence points. Typically, the antenna units may be positioned with phase center thereof at the respective convergence point. The antenna units are configured for transmission/reception of electromagnetic radiation within respective selected angular ranges and corresponding radiation pattern. The radiation pattern is typically determined by the antenna structure. Isotropic transmission/reflection characteristics of the radome are sometimes preferred in order to allow for a more uniform electromagnetic behavior of an antenna within the radome in certain angular limits. In addition to this, it will simplify the radome electrical analysis and make the antenna operation within the radome more predictable within said angular ranges.

The radome of the present technique is generally formed using an additive manufacturing technique. This manufacturing technique may result in certain limitations of materials, and respective transmission properties of the radome. However, additive manufacturing techniques provide additional freedom in design of the radome structure to provide desired effective transmission properties. To this end the present disclosure provides a radome having at least one tessellated layer, typically formed in an additive manufacturing technique. The at least one tessellated layer is formed of selected features such as walls and/or rods that form an arrangement of cells, where the features of the tessellated layer align with general direction of propagation of radiation emitted from one or more selected locations under the radome. In other words, features of the tessellated layer are associated with a feature vector, defining direction and symmetry of the feature, and are arranged such that the respective feature vector is at least partially parallel to general direction of propagation of radiation emitted from the selected location within a respective section of the radome. For example, in some embodiments where features of the one or more tessellated layers formed by arrangement of rods (or rod-like features), a feature vector of a selected feature may be determined by a vector sum of the rods defining the feature.

In some configurations, the one or more tessellated layers may be formed of an arrangement of features defining a generally repeating features (e.g., unit cells). For example, the features of the tessellated layer may be generally rod-shaped (e.g., forming edges of pyramid structures), wall shaped, or other. In such configurations, the unit cells of the tessellated layer may be represented by a feature vector, generally originating at a central point on a base of each feature and defining a general spatial direction of the feature. The features of the one or more tessellated layers are oriented such the respective feature vectors extend along a direction aligned with radiation pattern of the antenna positioned at the respective convergence point. For example, the feature vectors may be parallel to general direction of radiation propagation at the specific location along the radome.

The at least one tessellated layer is generally formed by a plurality of repeating three-dimensional features forming unit cells of the tessellated layer. Where the different features/unit cells are aligned in accordance with radiation pattern of one or more antenna units placed within the radome, at one or more respective convergence points. Each of the three-dimensional features is defined by a feature vector, defining orientation of the unit cell. For example, for trapezoid or triangular pyramid type features, a respective feature vector extends from a central location at base of the feature, directed toward a meeting point of walls or rods forming the feature as exemplified in more detail further below. The at least one tessellated layer is formed such the feature vectors of features along the layer are aligned with respect to radiation pattern of one or more antenna units positioned at the respective convergence points.

This arrangement provides that cross-section between features of the tessellated layer and radiation emitted from the selected location (or collected thereby) is constant within angular range of the respective section of the radome. Accordingly, the radome essentially affects radiation passing therethrough after being emitted from the antenna unit, or prior to being received by the antenna unit, in a similar manner regardless of radiation direction or the section of the radome the radiation passes through. This allows for a generally uniform electromagnetic behavior of the antenna with the radome than otherwise would be, with respect to varying angular directions of transmission/reception.

According to some embodiments of the present disclosure, alignment of features of the tessellated layer provides that a cross-section between the features and direction of radiation propagation is independent of angular direction within selected angular range with respect to selected location. When an antenna unit or any other radiation emitting/receiving unit, positioned at a selected convergence point. The effect of the radome on the antenna radiation is substantially the same independent of the direction of emission or portion of the radome where the radiation passes through.

The present technique comprises selecting, or providing parameters for, a selected external shape of the radome and data on one or more convergence points around which selected sections of the radome are to be isotropic. Generally, the one or more convergence points may relate to locations of one or more antenna units (e.g., phase centers thereof). Each of the antenna units is configured to transmit/receive radiation in a selected angular range associated with a section of the radome. Accordingly, different sections of the radome may be configured to provide isotropic transmission properties with respect to selected locations inside/under the radome.

For each of the selected convergence locations, the technique comprises determining a general propagation path of radiation propagating away from the respective location. The propagation path for any one of the selected convergence locations may be determined within an angular range associated with a specific convergence location, to align with an angular range of a corresponding antenna unit.

Using the general propagation paths for the one or more convergence locations, the technique utilizes determining an intersection between the external shape and the general propagation paths. At different positions along the radome, features of the one or more tessellated layers are selected to substantially align with radial portion of the general propagation path at that position. Alignment and orientations of features of the one or more tessellated layers is selected for each section of the radome to ensure that the features are generally parallel to the radial axis with respect to the selected convergence point (e.g., location of antenna phase center) associated with the section. This alignment of the features of the one or more tessellated layers of the radome and propagation path of radiation emitted from or directed towards the selected location, provides that the one or more tessellated layers affect radiation isotopically. More specifically, transmission properties of the radome are generally constant for different directions within angular range of coverage of the antenna unit. Generally, a cross section for interaction between the radiation and the features of the tessellated layer is constant to angular variations within a respective angular range. The interaction cross section is thus independent of angle.

Following selection of the radome design, including features of the tessellated layer and alignment of the features in each section of the radome, the technique may comprise generating manufacturing instructions and transmitting the manufacturing instructions to one or more facilities for additive manufacturing.

Accordingly, radome has one or more tessellated layers, where the tessellated layer may have a complex form including one or more features. The present technique utilizes arrangement of features of the tessellated layer to provide the radome with a substantially angle independent transmission/receiving properties. It should be noted that across the one or more layers of the radome, including in some embodiments across the tessellated layer thereof, the effective dielectric properties of the radome wall may vary, i.e., varying along the radial direction, or along path of propagation of radiation.

Further, the term effective transmission properties used hereinbelow, relates transmission properties in a generally large scale of the tessellated layer. More specifically, transmission properties may relate to ratio of radiation transmission, as well as other properties such as reflection and absorption, occurring while radiation passes through layers of the radome. The local transmission properties are dictated by dielectric properties of the materials selected, and may be affected by surface design (e.g., surface roughness) and orientation. Effective transmission properties relate to some form of local spatial averaging of the transmission properties within an angular aperture characteristic of the radiating (or receiving) unit. As indicated above, the present technique is directed at providing angle independent effective transmission properties of the radome with respect to specific convergence locations underneath the radome. This is generally providing by radome design, including e.g., angular orientation of material interfaces within the tessellated layer (between features of the layer and surrounding voids/air) with respect to radiation propagation, is substantially angle independent for radiation transmission.

Generally, the present disclosure provides a radome comprising one or more tessellated layers. At least one of the tessellated layers comprises a plurality of generally repeating structural features, each of the repeating structural features is defined by a feature vector defining a direction of feature elements. For example, in a pyramid feature, the feature vector extends from center of pyramid base to tip thereof. The feature vectors for all features within a selected region of the radome are aligned extending from a common convergence point. The common convergence point defined a location where an antenna unit is to be places within the radome. This provides slight changes in direction and/or size if different features in accordance with relative location and/or distance of the feature from the respective convergence point. The radome may comprise one or more regions associated with or more respective convergence points, where each convergence point is associated with a selected angular range, where feature vectors of the one or more tessellated layers are aligned with radial direction emerging from the respective convergence point.

Thus, according to a broad aspect, the present disclosure provides a method for use in designing a radome, the method comprising:

providing data on physical shape of the radome, and data on one or more convergence points within said radome;

determining general propagation paths mapping propagation of radiation from said one or more convergence points, and one or more selected angular ranges for emission from at least one of said convergence points;

determining intersection of said external shape and said mapping of the general propagation paths, within at least said one or more selected angular ranges, and determining one or more tessellated layers for said radome, wherein cross-section of elements of said one or more tessellated layer with said general propagation path of radiation emitted from the respective convergence location is constant within said one or more selected angular ranges.

According to some embodiments, providing effective radiation transmission properties may be invariant to angle of transmission within said one or more selected angular ranges.

According to some embodiments, wherein said effective radiation transmission properties may comprise dielectric properties of said one or more tessellated layers.

According to some embodiments, cross-section of elements of said one or more tessellated layer with said general propagation path or radiation emitted from the respective convergence location may be defined by angular relation between feature vector of elements of the one or more tessellated layers and direction of propagation of radiation at the respective location along the one or more tessellated layers.

According to some embodiments, the method may further comprise generating instructions for an additive manufacturing system for printing of at least said one or more tessellated layers.

According to some embodiments, the method may further comprise determining structure of at least one external layer formed on said one or more tessellated layers.

According to some embodiments, the method may further comprise determining structure of at least one internal layer formed on said one or more tessellated layers, being located between the one or more tessellated layers and location of said one or more convergence points.

According to some embodiments, said one or more convergence points may indicate, or be selected in accordance with, positions of one or more antenna units, said one or more selected angular ranges may indicate, or be selected in accordance with, angular ranges covered by the one or more antenna units.

According to some embodiments, said providing data on location of one or more convergence locations within said radome structure may comprise providing data on phase center location of at least one antenna unit to be positioned in at least one of the one or more convergence points.

According to some embodiments, providing data on location of convergence points within said radome structure may comprise providing data on phase center locations of two or more antenna units and respective two or more different angular ranges for radiation emission from said two or more antenna units.

According to some embodiments, the method may comprise defining at least first and second general propagation paths for radiation emitted from respective one of said two or more antenna units, determining intersection of said first general propagation paths with said external shape in angular range associated with radiation emission from a first antenna unit, and intersection of said second general propagation paths with said external shape in angular range associated with radiation emission from a second antenna unit, and determining structure of said one or more tessellated layers having a first portion associated with said first angular range having cross-section of features of said one or more tessellated layers being constant to angular variation with respect to phase center location of said first antenna unit and a second portion associated with said second angular range having cross-section of features of said one or more tessellated layers being constant to angular variation with respect to phase center location of said second antenna unit.

According to some embodiments, said one or more tessellated layers may be formed of a plurality of features, wherein said cross section is defined by relative angle between plane of structure walls between the features and general propagation path of radiation emitted from phase center location of a respective antenna unit.

According to some embodiments, said one or more tessellated layers may be configured with open elements of unit cells thereof facing location of the respective antenna unit for different angles within a selected angular range, thereby providing effective radiation transmission properties being invariant to angle of transmission.

According to some embodiments, the method may be implemented by one or more computer processors.

According to one other broad aspect, the present disclosure provides a radome structure having selected shape and configured for covering one or more antenna units associated with respective one or more selected phase center locations and having respective one or more radiation patterns, said radome structure comprises at least one tessellated layer formed by a plurality of generally repeating three-dimensional features each defining a feature vector, wherein feature vectors, within at least one portion of said radome structure defined by one or more selected angular ranges for radiation emission/receiving by one or more of said antenna units at a respective phase center location, being aligned with respect to radiation pattern of a respective antenna unit at the selected phase center location, thereby providing invariant effective radiation transmission properties with respect to angle of transmission within said one or more selected angular ranges.

According to some embodiments, said feature vector may be defined by vector sum of spatial elements forming said feature.

According to some embodiments, wherein said feature vector may be a vector defining spatial direction of a feature, generally extending from based layer of a feature extending along general symmetry axis of said feature.

According to some embodiments, the radome may be formed by additive manufacturing technique.

According to some embodiments, said at least one tessellated layer may be formed of one or more materials selected from: thermoplastic, thermoset, composite, and resin materials.

According to some embodiments, said at least one tessellated layer may comprise a core layer of said radome structure.

According to some embodiments, the radome structure may further comprise at least one continuous layer being internal or external with respect to the at least one tessellated layer and said one or more selected phase center locations.

According to yet another broad aspect, the present disclosure provides a radome structure having selected shape and configures for covering one or more antenna units with respective one or more selected phase center locations, said radome structure comprises at least one tessellated layer; wherein at least a portion of said radome, defining one or more selected angular ranges for radiation emission/reception by antenna units located at one or more of said selected phase center locations is characterized by cross section between features of the at least one tessellated layer and path of radiation propagating away from said selected phase center being constant to angular variation within the respective one or more selected angular ranges, thereby providing effective radiation transmission properties being invariant to angle of transmission within said one or more selected angular ranges.

According to some embodiments, the radome structure may be formed by additive manufacturing technique.

According to some embodiments, the at least one tessellated layer may be formed of one or more materials selected from: thermoplastic, thermoset, composite, and resin materials.

According to some embodiments, the at least one tessellated layer may comprise a core layer of said radome structure.

According to some embodiments, the radome structure may further comprise at least one continuous layer being internal or external with respect to the at least one tessellated layer and said one or more selected phase center locations.

According to some embodiments, the at least one tessellated layer may be formed of a plurality of spatial features, wherein said cross section is defined by relative angle between plane of structure walls between the features and general propagation path of radiation emitted from phase center location of a respective antenna unit.

According to some embodiments, the at least one tessellated layer may be formed of a plurality of repeating three-dimensional features, each of said repeating feature being defined by a feature vector associated with symmetry of the feature and defining direction thereof, said cross section is defined by relative angle between feature vector and radial axis with respect to a selected phase center location.

According to some embodiments, the tessellated structure may be configured with open elements of unit cells thereof facing location of the respective antenna unit for different angles within a selected angular range, thereby providing effective radiation transmission properties being invariant to angle of transmission.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Radomes are typically used to provide protection to various electronic equipment from environmental conditions. Radomes may often be configured with a selected external shape to provide desired aerodynamic or hydrodynamic properties. A typical electronic equipment that may be placed under radome structure may include antenna systems. To enable proper operation of the antenna system, the radome structure may be formed of materials having selected transmission properties with respect to radiation of one or more selected wavelengths, typically used by the antenna system.

Figure 1:
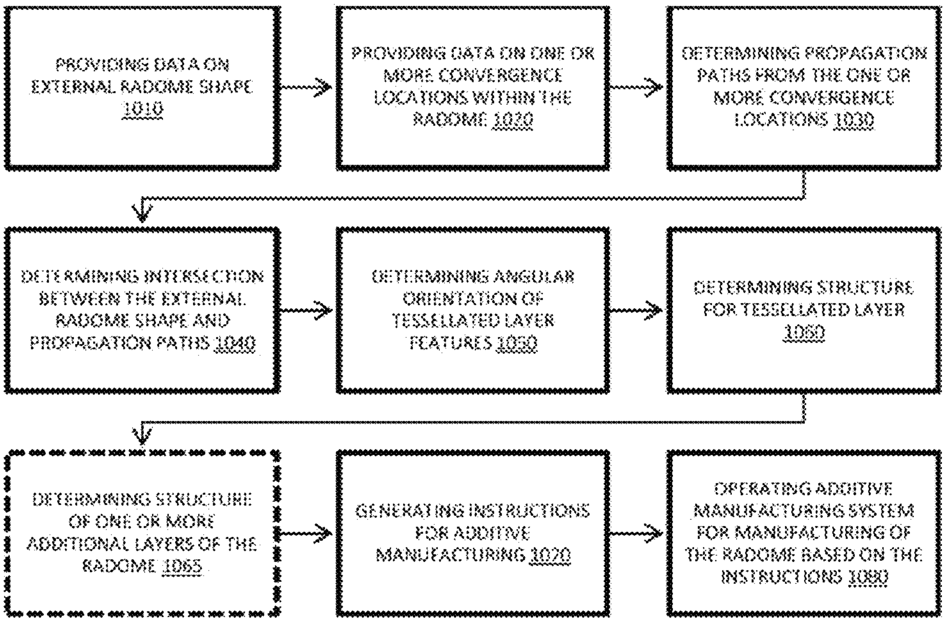
FIG. 1 exemplify operation actions for providing a radome according to some embodiments of the present disclosure.

The present disclosure provides a radome design and method for designing a radome, having desired effective transmission properties for radiation emitted from, or received by, one or more antenna units located therein. Reference is made to FIG. 1 illustrating schematically operational actions for determining a radome design according to the present disclosure. As shown, the radome design is based on data regarding the external radome shape 1010. The external radome shape may be determined based on various factors including e.g., aerodynamic, or hydrodynamic properties, as well as other requirements. Additionally, selected location of one or more convergence points within the radome are provided 1020. The convergence points typically relate to location of one or more antenna units to be positioned within the radome. Generally, the one or more convergence points may be associated with angular range for which the convergence point relates. For example, a convergence point may be determined based on position of an antenna unit (e.g., being phase center of the antenna unit) configured to emit or receive radiation covering a selected angular span. The technique of the present disclosure thus operates for determining a propagation path of radiation from the different one or more convergence points 1030. The technique further includes determining an intersection between the external shape of the radome and the propagation path of radiation along the shape of the radome 1040. This intersection provides data on angular orientation of features of a tessellated layer of the radome along its shape 1050. More specifically, the tessellated layer includes one or more layers of the radome formed of spatial features selected to provide structural strength at desired radome weight, and desired transmission properties. Generally, the one or more tessellated layers provide specific structural strengths to the radome. The angular orientation of the features may be defined as respective feature vectors. Generally, such feature vectors define structure and direction of the features and may indicate symmetry of the different features of the one or more tessellated layers. For one or more selected sections of the radome, the one or more tessellated layers are formed with features having feature vectors aligned with propagation path of radiation emitted/received by antenna positioned at the respective convergence point. Generally, the emitted/received radiation may propagate in radial direction with respect to a corresponding convergence point indicating location of a respective antenna unit. Typically, the feature vectors are aligned with local symmetry of the three-dimensional features. This is exemplified in FIGS. 5, 6A and 6B below.

Using the determined angular orientations, e.g., determined as feature vector, the technique includes determining the structure of the one or more tessellated layers 1060. Structure of the features of the tessellated layer may be selected based on various requirements and may include arrangement of walls defining unit cells of the tessellated layer, arrangement of rods/tubes defining feature of the tessellated layer or various combinations thereof, or other structures forming the unit cells of the repeating features. Accordingly, the different features of the tessellated structure can be defined by a base and a spatial structure extending from the base and being associated with a feature vector. In this connection, determining structure of the one or more tessellated layers may include selecting feature type, and arranging the features along shape of the radome such that feature vector at of each unit cell is directed parallel to direction of propagation of radiation emitted from a respective convergence point.

In combination with determining the structure of the one or more tessellated layers, the technique may include determining structure of one or more additional layers of the radome 1065. The additional layers may include internal and/or external layers, typically formed of a continuous layer covering the radome. In some configurations, additional layers may also include intermediate layers, e.g., located between first and second tessellated layer.

Using the determined structure of the one or more tessellated layers, and possibly structure of additional layers, the technique operates for generating instructions for forming the radome using additive manufacturing techniques 1070. The instructions may be in the form of diagram sheets and/or computer readable instructions using one or more formats in accordance with selected additive manufacturing technique and the respective hardware. Using the so-generated instructions, the technique may further include operating one or more additive manufacturing systems for forming the radome 1080 based on the above-described technique. For example, one or more tessellated layers may be formed in additive manufacturing, while the radome may be complete in a layer-by-layer or other process. Alternatively, the entire radome may be formed in additive manufacturing process. The so-generated radome is configured to provide similar effective transmission properties to radiation transmitted from, or received by, one or more antenna units, located in the respective convergence points and oriented toward respective angular ranges. This is achieved as cross-section of features of said one or more tessellated layers with radiation portions propagating along a general propagation path from or toward the respective convergence point is constant to angular variation within an angular range selected for the specific convergence point. The cross-section between features of the tessellated layer and radiation propagation path can be defined by scalar product of feature vector and direction of propagation of radiation emitted/received at a respective convergence point. This is as opposed to conventional radome structures where spatial configuration of the features is repeating along the tessellated layer, and variation in angular relation between feature vector and propagation direction of the radiation may affect the effective transmission properties of the radome.

The effective transmission properties of the radome typically include transmission properties properly averaged over a region of the radome (e.g., within certain angular range or for a selected beam width). Additionally, the effective transmission properties also include variation of the transmission properties with respect to direction of propagation of the radiation. This may be associated with angular relation between path of radiation and features of the one or more tessellated layers, causing unintentional and possible adversary electromagnetic phenomena such as scattering.

Generally, a unit cell, or base area of features of the tessellated layer, is of order of a wavelength of radiation used by the antenna unit located at the respective convergence point and may preferably be smaller than a wavelength of the radiation. Accordingly, in some configurations, where the radome is configured to house two or more antenna units operating using two or more different wavelength ranges, the present technique may include determining different types or sizes of features for regions of the radome associated with transmission/receiving angular ranges of the two or more antenna units.

Figure 2:
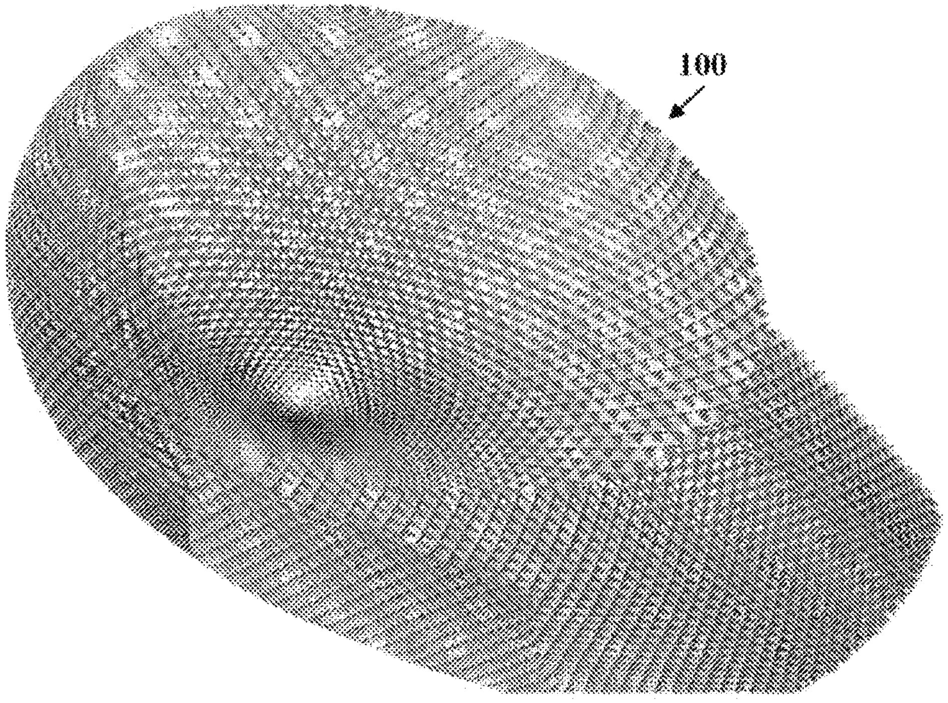
FIG. 2 exemplifies a tessellated layer of a radome according to some embodiments of the present disclosure.
Figure 3A:
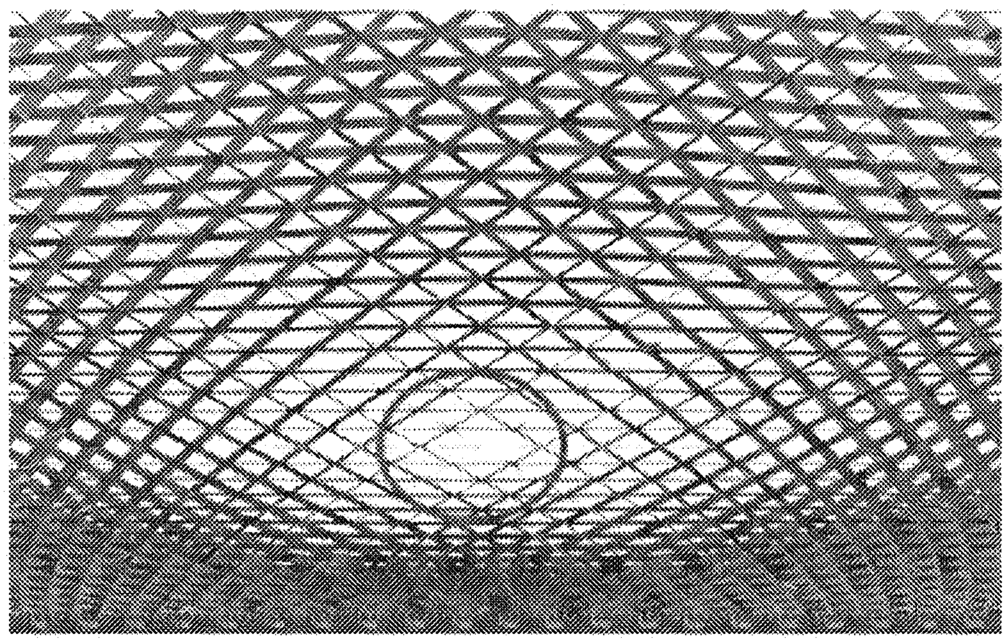
FIGS. 3A and 3B exemplify regions of the tessellated layer of the radome exemplified in FIG. 3, as seen from a respective convergence point facing at azimuth 0 degrees and azimuth 60 degrees respectively.
Figure 3B:
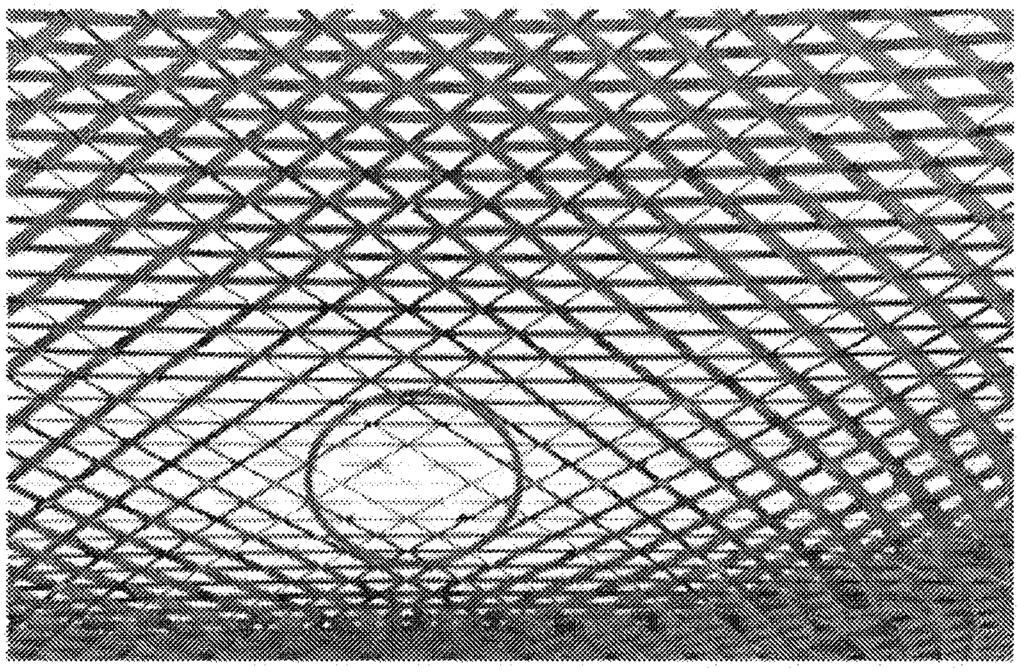

Reference is made to FIG. 2 exemplifying a configuration of tessellated layer of a radome 100 formed according to some embodiments of the present disclosure. In this example, the tessellated layer is formed of a plurality of triangular units defined by separating walls and arranged such that the walls are substantially perpendicular to direction of propagation of radiation emitted from antenna unit located at a selected position within the radome. FIGS. 3A and 3B illustrate the tessellated layers from point of view of the antenna unit located at the respective convergence point at azimuth angle of 0° and 60° respectively. Features of the tessellated layer that are in path of radiation emitted from the antenna, or to be collected by the antenna, are aligned to have a generally constant angular relation with propagation path or radiation for different angular directions.

More specifically, in the example of FIGS. 3A and 3B, features of the tessellated layer are arranged to provide effective windows facing the antenna unit in different directions to provide generally uninterrupted path for radiation transmitted from or collected by the antenna unit through the radome.

Figure 4:
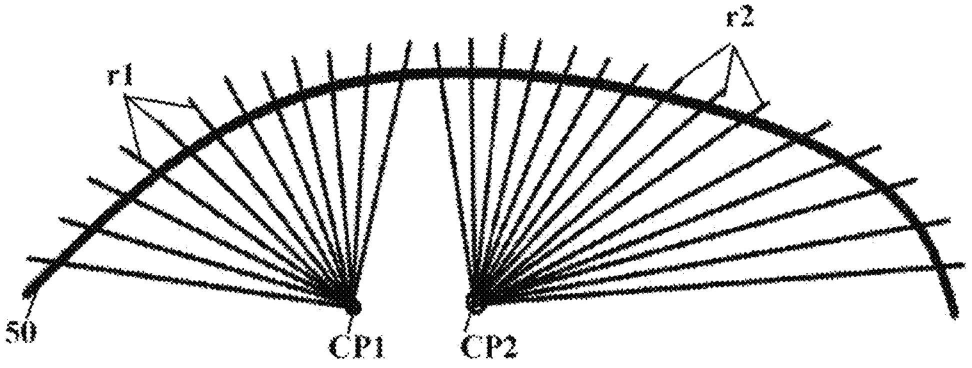
FIG. 4 exemplifies arrangement of feature vectors extending from convergence points within a radome according to some embodiments of the present disclosure.

An example illustrating determining an intersection between the external shape of the radome and the propagation path of radiation along the shape of the radome is shown in FIG. 4. FIG. 4 illustrates a radome shape 50, configured to hold underneath it two antenna units positioned at convergence points CP1 and CP2. Each of the antenna units is configured to cover a selected angular range. Propagation paths of radiation transmitted or received by the respective antenna units are illustrated by lines r1 and r2. Direction of the radiation propagation paths r1 or r2 at each point along contour of the radome 50 indicates the direction of the respective feature vector. Accordingly, orientation of features along contour of the radome 50 typically vary in accordance with angular orientation of the contour and respective convergence point to provide that relative cross section between radiation propagating to or from the convergence point, and spatial structure of the features of the tessellated layer at that point is similar to different positions along contour of the radome 50. Accordingly, typical features of the tessellated layer need not be parallel to normal of the radome surface and may be directed at a certain direction having some angle with the normal of the radome surface.

Figure 5:
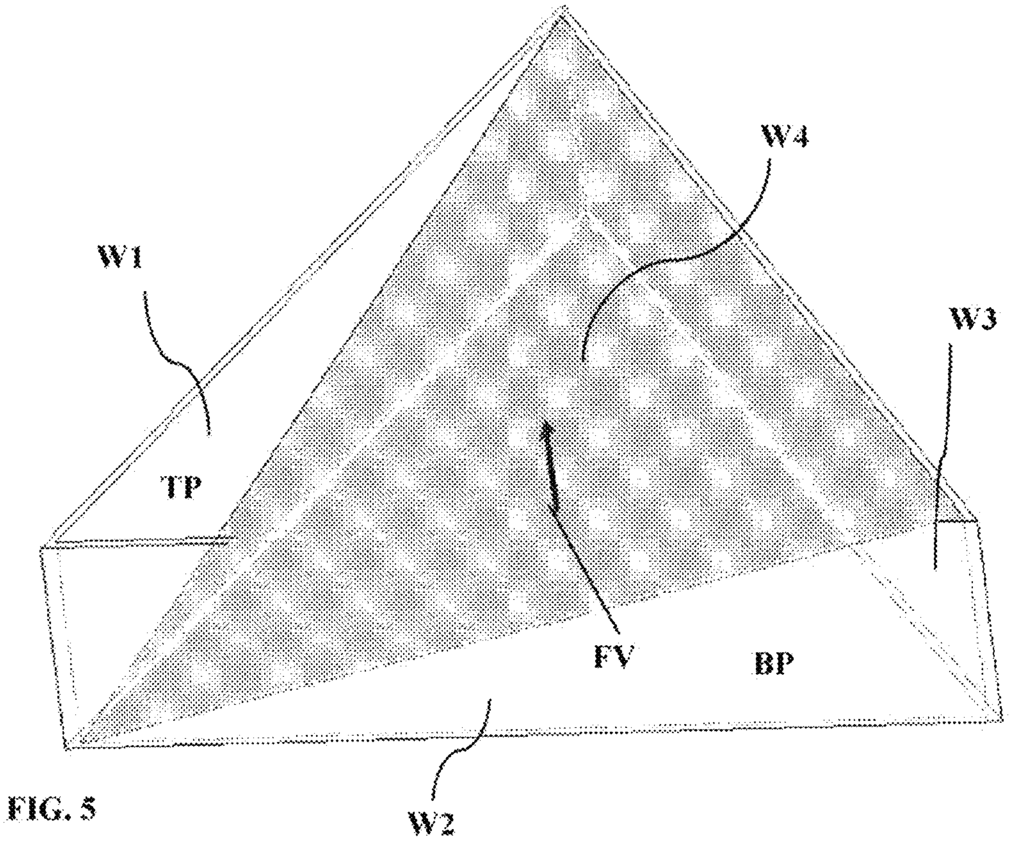
FIG. 5 exemplifies a triangular feature of a tessellated layer formed by three walls and including an internal wall.

It should be noted that the term “effective window” is used here to exemplify configuration of the features of the tessellated layer and does not necessarily indicate that the unit cell is open. Generally, the radome structure may include one or more additional layers that are continuous and may extend along the radome structure, such as internal/external sheet layers. Further, features of the tessellated layer may also provide elements defining a plane that intersects propagation of radiation from the antenna unit. For Example, FIG. 5 illustrates an exemplary configuration of a feature of a tessellated layer formed as a triangular portion formed of walls W1, W2 and W3 as exemplified in FIGS. 3A and 3B, and internal wall portion W4 extending within the unit cell of the feature. Feature vector FV is illustrated passing through the feature, generally at equal angular relation to walls W1, W2 and W3. The feature vector FV generally extends from a base plane BP of the feature, externally toward a top plane TP of the feature. The feature vector FV is positioned at geometrical center of the feature, typically aligned with a symmetry axis of the feature providing similar angular relations and distance to the different walls W1-W3 of the feature.

Figure 6A:
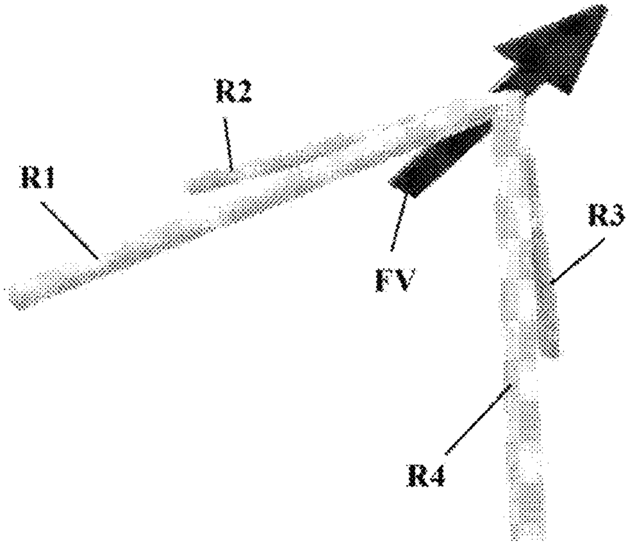
FIGS. 6A and 6B exemplify pyramid shaped features formed by rods, and illustrating feature vector and alignment of feature vectors with respect to convergence point within the radome according to some embodiments of the present disclosure.
Figure 6B:
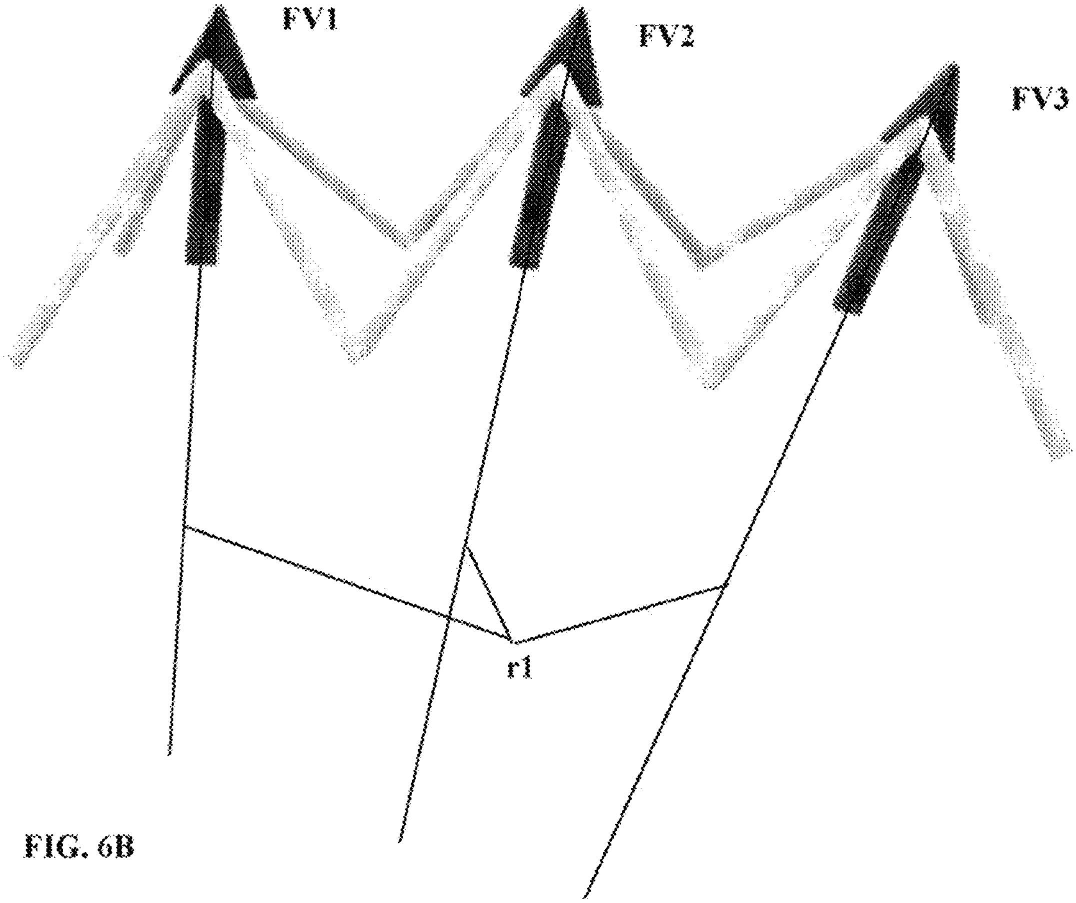

Additional example of features of the tessellated layer is shown in FIGS. 6A and 6B. In this example, the feature is formed of four rods R1 to R4, arranged in a pyramid structure. FIG. 6A illustrates a single feature having feature vector FV extending from base of the pyramid structure towards a point where the rods intersect. FIG. 6B illustrates three features arranged along a contour of the radome, each defined by a slightly shifted feature vector FV1 to FV3. The different feature vector FV1 to FV3 are aligned in accordance with a propagation path of radiation r1 emerging from a selected convergence point, where an antenna is to be located. As illustrated, the feature vector actually defines form and direction of the three-dimensional features and may generally be aligned with one or more symmetry axes of the feature or may be aligned with intersection of symmetry planes of the feature.

Figure 7:
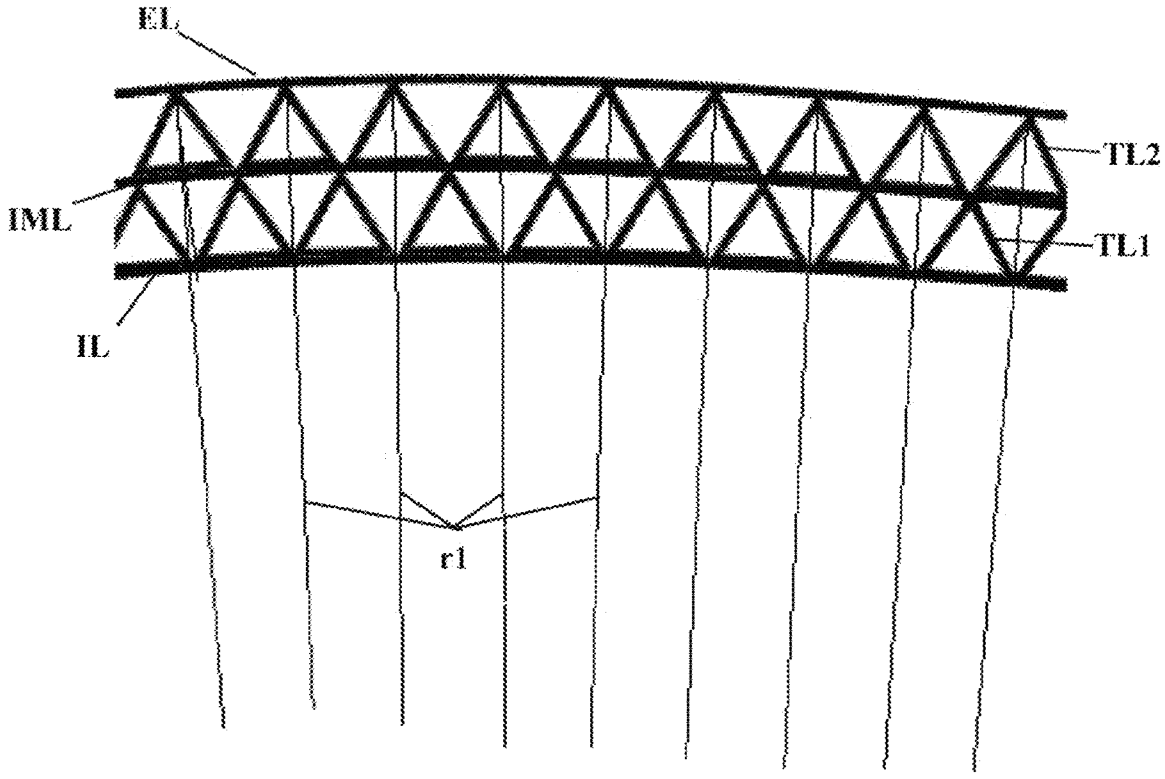
FIG. 7 exemplifies arrangement of two or more tessellated layers and illustrating feature vector and alignment of feature vectors with respect to convergence point within the radome according to some embodiments of the present disclosure.

As indicated above, the radome may include one or more tessellated layers. The number of tessellated layers and construction of the features of the layers is selected in accordance with a desired strength and weight ratio of the radome, as well as sheer tolerance, and electrical features. FIG. 7 exemplifies a radome section having two tessellated layers TL1 and TL2, separated by an intermediate layer IML. The radome section is also exemplified having internal layer IL and external layer EL, which may be part of the additive manufacturing but may also be added separately after the additive manufacturing process. As illustrated in FIG. 7, the features of the tessellated layers TL1 and TL2 are arranged of angular orientation in accordance with propagation r1 path of radiation emitted from or collected by a source located at a selected convergence point within the radome.

Generally, after designing a radome structure as described above, the technique includes generating instructions suitable for additive manufacturing, and material requirements. The design instructions may be implemented by additive manufacturing of the radome itself, or the one or more tessellated layers thereof. This may be done using three-dimensional printing techniques or any other additive manufacturing techniques. Additionally, or alternatively, the design instructions may be printed or stored in a computer readable data, to be transmitted to a dedicated additive manufacturing facility. The so-generated radome may be tested with respect to dielectric constant (ε) of the materials and loss factor (tan δ) of radiation transmitted through the radome along selected paths. The selected paths are selected in accordance with selected one or more convergence points within the radome, where one or more antenna units are to be placed.

Accordingly, the present disclosure provides a radome, typically formed by additive manufacturing, having one or more tessellated layers formed by a plurality of features. Each of the features of the one or more tessellated layers is defined by a respective feature vector. Features of the one or more tessellated layers are aligned to provide that feature vectors thereof extend radially from one or more selected convergence points within the radome. More specifically, each of the one or more convergence points is characterized by a respective angular range, and features of the tessellated layer within the angular range are arranged to provide that feature vectors thereof extend radially from the respective convergence point. This configuration provides cross section between path of radiation emitted from or collected by one or more antenna units positioned at the one or more convergence points, is constant with respect to angular variation of radiation transmission/reception.

This configuration of the one or more tessellated layers of the radome, provides effective transmission properties of the radome, to be constant to angular variation of radiation transmission/reception by one or more antenna units located at one or more convergence points within the radome. Further, the use of additive manufacturing techniques provides for simplifying radome design and manufacturing process as opposed to manual layering of the radome structure. Additional advantages of additive manufacturing in generating radome structure relate to manufacturing costs, speed, labor requirements and environmental effects such as reduced waste generated during manufacturing process.

It is to be noted that the various features described in the various embodiments can be combined according to all possible technical combinations.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based can readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

The invention claimed is:

1. A method for use in designing a radome, the method comprising:

(a) providing data on a selected external shape of the radome, and data on one or more convergence points within said radome;

(b) determining general propagation paths mapping propagation of radiation at least one of from or toward said one or more convergence points, and one or more selected angular ranges for at least one of emission or reception with respect to at least one of said convergence points;

(c) for each location along the selected external shape within at least said one or more selected angular ranges, determining an intersection between the selected external shape and a corresponding one of the general propagation paths to obtain a local propagation direction at said location;

(d) determining one or more tessellated layers for said radome, the one or more tessellated layers being formed of spatial features comprising at least one of walls or rods that define an arrangement of cells selected to provide structural strength at a desired radome weight and at least one of desired radiation transmission properties or desired radiation reception properties;

(e) assigning to each spatial feature a respective feature vector defining a spatial direction of spatial features; and (f) arranging the spatial features such that, within a selected region associated with a respective one of the convergence points, the feature vectors are aligned with the corresponding local propagation directions, thereby providing at least one of effective radiation transmission properties or effective radiation reception properties that are substantially invariant with respect to angular variation within said one or more selected angular ranges.

2. The method of claim 1, wherein arranging the spatial features provides effective radiation transmission properties being invariant to angle of transmission within said one or more selected angular ranges.

3. The method of claim 2, wherein said effective radiation transmission properties comprises dielectric properties of said one or more tessellated layers.

4. The method of claim 1, wherein an effective interaction cross-section to radiation cross-section is determined by an angular relation between the feature vector of a respective spatial feature and the local propagation direction at a respective location along the selected external shape.

5. The method of claim 1, further comprising generating instructions for an additive manufacturing system for printing of at least said one or more tessellated layers.

6. The method of claim 1, further comprising determining structure of at least one of an external layer formed on said one or more tessellated layers and an internal layer formed on said one or more tessellated layers, being located between the one or more tessellated layers and location of said one or more convergence points.

7. The method of claim 1, wherein said one or more convergence points indicate positions of one or more antenna units, said one or more selected angular ranges indicate angular ranges covered by the one or more antenna units.

8. The method of claim 1, wherein said providing data on location of one or more convergence points within said radome structure comprises providing data on phase center location of at least one antenna unit to be positioned in at least one of the one or more convergence points.

9. The method of claim 1, wherein providing data on location of convergence points within said radome structure comprises providing data on phase center locations of two or more antenna units and respective two or more different angular ranges for at least one of radiation emission or radiation reception from said two or more antenna units, and wherein the method comprises defining at least first and second general propagation paths for at least one of radiation emitted from or radiation received by respective ones of said two or more antenna units, determining, for locations along the selected external shape within a first angular range associated with a first antenna unit, intersections between the intersection of said first general propagation paths and the selected external shape to obtain first local propagation directions;

determining, for locations along the selected external shape within a second angular range associated with a second antenna unit, intersections between the second general propagation paths and the selected external shape to obtain second local propagation directions; and determining structure of said one or more tessellated layers having a first portion associated with the first angular range and a second portion associated with the second angular range, wherein spatial features in the first portion are arranged such that feature vectors thereof are aligned with the first local propagation directions, and spatial features in the second portion are arranged such that feature vectors thereof are aligned with the second local propagation directions, thereby providing effective radiation transmission and/or reception properties that are substantially invariant with respect to angular variation within the first and second angular ranges.

10. The method of claim 1, wherein the one or more tessellated layers comprise spatial features comprising walls that define cells, and an effective interaction cross-section to radiation is determined by an angular relation between a plane defined by one or more walls of a respective spatial feature and the local propagation direction at the respective location.

11. A radome structure having a selected external shape and configured for covering one or more antenna units associated with respective one or more selected phase center locations, said radome structure comprising:

at least one tessellated layer formed of a plurality of generally repeating three-dimensional spatial features comprising at least one of walls or rods that define an arrangement of cells, the at least one tessellated layer providing structural strength to the radome at a desired radome weight, each spatial feature being associated with a respective feature vector defining a spatial direction of the spatial feature, wherein, within at least one portion of said radome structure corresponding to one or more selected angular ranges for radiation emission and/or reception by one or more of said antenna units at a respective phase center location, the feature vectors of the spatial features are aligned with local propagation directions extending between the respective phase center location and corresponding locations along the selected external shape, thereby providing at least one of effective radiation transmission properties or effective radiation reception properties that are substantially invariant with respect to angular variation within said one or more selected angular ranges.

12. The radome structure of claim 11, wherein said feature vector is defined by vector sum of spatial elements forming said feature.

13. The radome structure of claim 11, wherein said feature vector is a vector defining a spatial direction of a respective spatial feature, the feature vector generally extending from a base of the spatial feature and being aligned with a general symmetry axis of the spatial feature.

14. The radome structure of claim 11, being formed by additive manufacturing technique.

15. The radome structure of claim 11, wherein said at least one tessellated layer is formed of one or more materials selected from: thermoplastic, thermoset, composite, and resin materials.

16. The radome structure of claim 11, wherein said at least one tessellated layer comprises a core layer of said radome structure.

17. The radome structure of claim 11, further comprising at least one continuous layer extending along the radome structure and located internal or external to the at least one tessellated layer.

18. A radome structure having a selected external shape and configured for covering one or more antenna units with respective one or more selected phase center locations, said radome structure comprising:

at least one tessellated layer formed of a plurality of spatial features comprising at least one of walls or rods that define an arrangement of cells, the at least one tessellated layer is configured to provide structural strength to the radome at a desired radome weight, each spatial feature being associated with a respective feature vector defining a spatial direction of the spatial feature;

wherein, for at least one portion of the radome structure corresponding to one or more selected angular ranges associated with a respective selected phase center location, the feature vectors of the spatial features are aligned with local propagation directions extending between the respective selected phase center location and corresponding locations along the selected external shape, such that a relative angular rational between the feature vectors and the local propagation directions is substantially constant within the respective one or more selected angular ranges, thereby providing at least one of effective radiation transmission properties or effective radiation reception properties that are substantially invariant with respect to angular variation within the respective one or more selected angular ranges.

* * * * *